(12) United States Patent
Huang et al.

(10) Patent No.: US 10,170,487 B2
(45) Date of Patent: Jan. 1, 2019

(54) DEVICE HAVING AN INTER-LAYER VIA (ILV), AND METHOD OF MAKING SAME

(71) Applicant: TAIWAN SEMICONDUCTOR MANUFACTURING COMPANY, LTD., Hsinchu (TW)

(72) Inventors: Tsung-Hsien Huang, Hsinchu (TW); Hong-Chen Cheng, Hsinchu (TW); Cheng Hung Lee, Hsinchu (TW); Hung-Jen Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/333,439

(22) Filed: Oct. 25, 2016

(65) Prior Publication Data

US 2017/0047333 A1 Feb. 16, 2017

Related U.S. Application Data

(63) Continuation of application No. 14/039,481, filed on Sep. 27, 2013, now Pat. No. 9,484,350.

(51) Int. Cl.
| | |
|---|---|
| *H01L 27/112* | (2006.01) |
| *H01L 23/522* | (2006.01) |
| *G11C 7/18* | (2006.01) |
| *H01L 21/768* | (2006.01) |
| *H01L 23/528* | (2006.01) |
| *H01L 27/06* | (2006.01) |

(52) U.S. Cl.
CPC ............ *H01L 27/1128* (2013.01); *G11C 7/18* (2013.01); *H01L 21/76816* (2013.01); *H01L 21/76877* (2013.01); *H01L 23/5226* (2013.01); *H01L 23/5283* (2013.01); *H01L 27/0688* (2013.01); *H01L 2924/0002* (2013.01)

(58) Field of Classification Search
CPC . H01L 51/56; H01L 51/0072; H01L 51/5206; H01L 51/5253; C09K 11/06
USPC ...................................................... 257/401
See application file for complete search history.

(56) References Cited

U.S. PATENT DOCUMENTS

| | | |
|---|---|---|
| 7,834,450 B2 | 11/2010 | Kang |
| 2005/0226068 A1 | 10/2005 | Brandon et al. |
| 2006/0220134 A1* | 10/2006 | Huo .................. H01L 21/84 257/351 |
| 2010/0207190 A1 | 8/2010 | Katsumata |
| 2011/0051509 A1 | 3/2011 | Rao |
| 2013/0009318 A1 | 1/2013 | Chia et al. |
| 2013/0248959 A1 | 9/2013 | Matsumoto et al. |
| 2013/0341724 A1 | 12/2013 | Erickson |
| 2013/0341733 A1 | 12/2013 | Erickson |

* cited by examiner

*Primary Examiner* — Andy Huynh
(74) *Attorney, Agent, or Firm* — Hauptman Ham, LLP

(57) ABSTRACT

A three-dimensional integrated circuit includes a first transistor, a word line, a first via, a second transistor, and a second via. The first transistor is on a first level and the second transistor is on a second level. The second level is different from the first level. The word line and the first via are coupled to the first transistor. The second via is coupled between the first transistor and the second transistor.

20 Claims, 10 Drawing Sheets

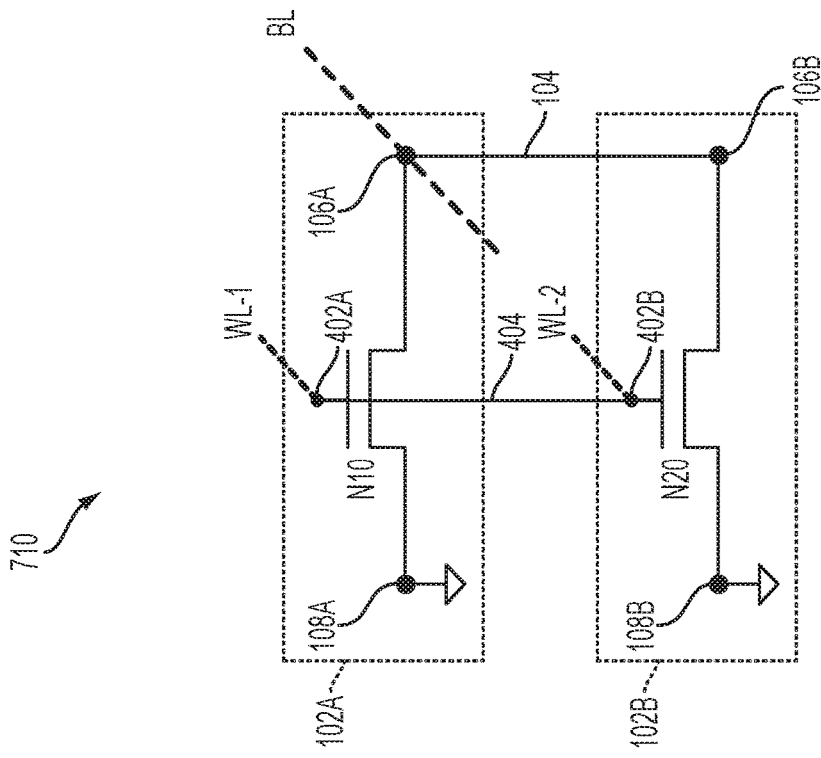
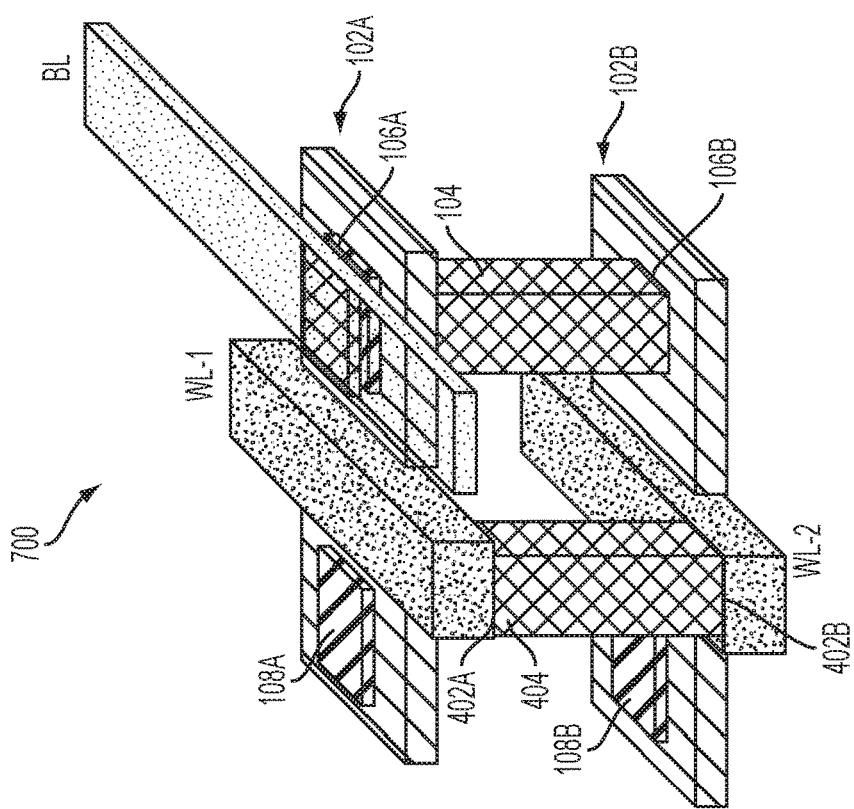
FIG. 7B
FIG. 7A

DEVICE HAVING AN INTER-LAYER VIA (ILV), AND METHOD OF MAKING SAME

PRIORITY CLAIM

The present application is a continuation of U.S. application Ser. No. 14/039,481, filed Sep. 27, 2013, now U.S. Pat. No. 9,484,350, issued Nov. 1, 2016, which is incorporated by reference herein in its entirety.

BACKGROUND

The integration density of various electronic components (e.g., transistors, diodes, resistors, capacitors, etc.) is improved by continual reductions in minimum feature size, which allow more components to be integrated into a given area. These smaller electronic components also require smaller packages that utilize less area and/or lower height than packages of the past, in some applications. Thus, new packaging technologies, such as a three dimensional (3D) packaging arrangement, have been developed. A 3D packaging arrangement has a central processing chip and each active circuit block located on a separate plane. Electrical routing lines are formed which connect active circuit blocks located on one plane with active elements on another plane.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

FIG. 7A is a perspective view of a semiconductor device in accordance with one or more embodiments;

FIG. 7B is a schematic diagram of a semiconductor device in accordance with one or more embodiments;

DETAILED DESCRIPTION

Figure 1A:
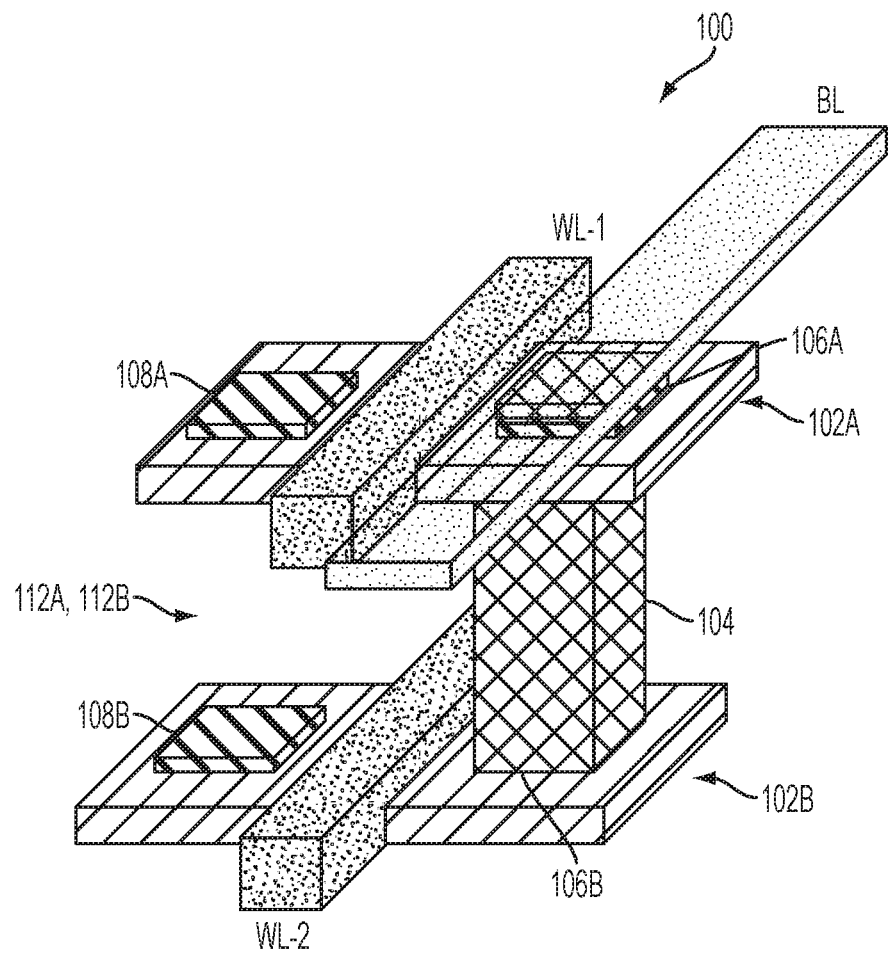
FIG. 1A is a perspective view of a semiconductor device in accordance with one or more embodiments.

The following disclosure provides many different embodiments, or examples, for implementing different features of the disclosed subject matter. Specific examples of components and arrangements are described below to simplify the present disclosure. These are examples and are not intended to be limiting.

This description of the various embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

FIG. 1A is a perspective view of a semiconductor device 100 including a 3D structure in accordance with one or more embodiments. The semiconductor device 100 is a 3D Integrated Circuit (IC) enabling ultra-high density integration at the individual transistor-level. In a 3D IC, each of the device layers is fabricated sequentially and is stacked upon the preceding layer. 3D standard cell libraries for IC design are divided into p-type Metal-Oxide Semiconductor Field Effect (PMOS) transistor devices and n-type NMOS transistor devices. Transistor-level 3D Integration (T-MI) places NMOS and PMOS transistors on different layers and interconnects the transistors by conductive lines including metal lines, vias, Through Substrate Vias (TSVs), Inter-Layer Vias (ILVs), Inter-Tier Vias (ITVs), etc. The semiconductor device 100 includes Read Only Memory (ROM) devices 102A and 102B, ILV 104, Word Lines WL-1 and WL-2, Bit Line BL, drain vias 106A and 106B and source vias 108A and 108B. In some embodiments, ILV 104 is a conductive material including copper, aluminum, alloys thereof or other suitable conductive materials. In some embodiments, drain vias 106A and 106B are a conductive material including copper, aluminum, alloys thereof or other suitable conductive materials. In some embodiments, source vias 108A and 108B are a conductive material including copper, aluminum, alloys thereof or other suitable conductive materials.

ROM devices 102A and 102B are positioned on different layers of semiconductor device 100 and are electrically connected by ILV 104. In some embodiments, ROM devices 102A and 102B are separated from each other by at least an Inter-Layer Dielectric (ILD) 112A or a substrate 112B. In some embodiments, ILV 104 is formed in the ILD 112A. In some embodiments, ILV 104 is formed in the substrate 112B. In some embodiments, the ILD ranges from about 30 nanometers (nm) to about 140 nm. Each of the ROM devices 102A, 102B includes NMOS transistors N10 and N20 (shown in FIG. 1B). In some embodiments, ROM devices 102A and 102B include PMOS transistors or a combination of PMOS and NMOS transistors. Each of the NMOS transistors N10 and N20 (shown in FIG. 1B) includes a gate, a drain and a source region. In some embodiments, the transistor devices include planar type and fin-type field-effect transistors (FinFETs). In some embodiments, planar-type transistor devices are separated from each other on different layers by an ILD thickness which ranges from about 110 nm to about 140 nm. In some embodiments, FinFET transistor devices are separated from each other on different layers by an ILD thickness which ranges from about 50 nm to about 75 nm. In some embodiments, the ILD 112A includes silicon oxide, silicon nitride, silicon carbide, silicon oxynitride or other suitable dielectric materials. In some embodiments, the substrate 112B includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, the substrate is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure. In some embodiments, a thickness of substrate 112B ranges from about 30 microns (μm) to about 50 μm.

ROM device 102A includes Word Line WL-1, Bit Line BL, source via 108A and drain via 106A. In some embodiments, Word Line WL-1 and Bit Line BL are parallel with each other. In some embodiments, Word Line WL-1 and Bit Line BL are perpendicular with each other. Drain via 106A is connected to the drain region of ROM device 102A. Source via 108A is connected to the source region of ROM device 102A. Word Line WL-1 is connected to the gate region of ROM Device 102A. The drain region of ROM device 102A is connected to the drain region of ROM device 102B by ILV 104. In some embodiments, the drain region of ROM device 102A is connected to the drain region of ROM device 102B by ILV 104 and drain vias 106A and 106B. Bit Line BL is connected to the drain region of ROM device 102A by drain via 106A. In some embodiments, drain via 106A connects the drain region of ROM device 102A to other metallization layers within semiconductor device 100. In some embodiments, source via 108A connects the source region of ROM device 102A to other metallization layers within semiconductor device 100. In some embodiments, ILV 104 has a diameter which ranges from about 65 nm to about 75 nm. In some embodiments, ILV 104 has a diameter which ranges from about 10.5 nm to about 11.5 nm. In some embodiments, the height of ILV 104 ranges from about 75 nm to about 140 nm. In at least some embodiments, the shape of ILV 104 is circular, rectangular, square, hexagonal, or includes other geometric shapes.

ROM device 102B includes Word Line WL-2, source via 108B and drain via 106B. In some embodiments, Word Line WL-1 and Word Line WL-2 are parallel with each other. In some embodiments, Word Line WL-1 and Word Line WL-2 are perpendicular with each other. In some embodiments, ROM device 102B includes another bit line. Drain via 106B is connected to the drain region of ROM device 102B. Source via 108B is connected to the source region of ROM device 102B. Word Line WL-2 is connected to the gate region of ROM Device 102B. ROM device 102B is connected to the Bit Line BL by ILV 104 and drain vias 106A and 106B. In some embodiments, drain via 106B connects the drain region of ROM device 102B to other metallization layers within semiconductor device 100. In some embodiments, source via 108B connects the source region of ROM device 102B to other metallization layers within semiconductor device 100.

Figure 1B:
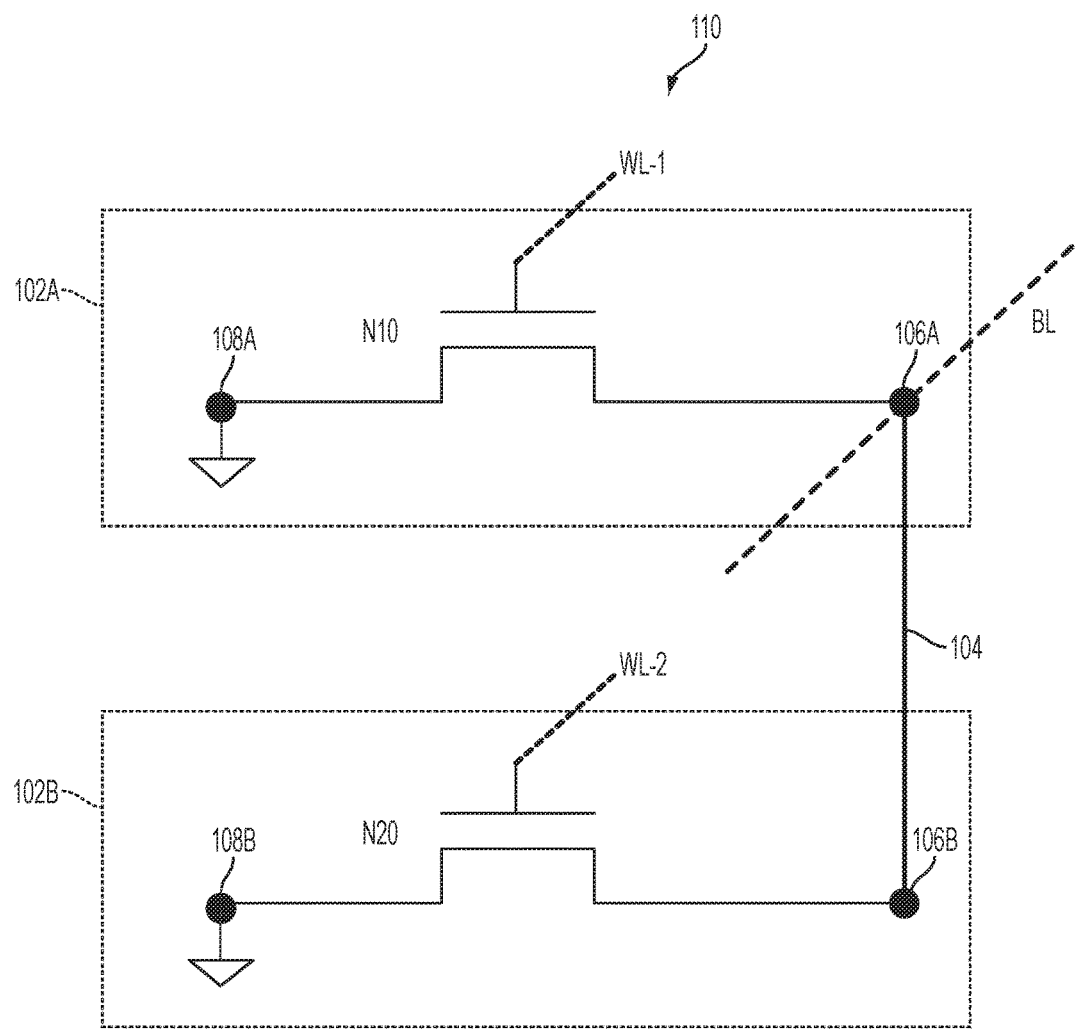
FIG. 1B is a schematic diagram of a semiconductor device in accordance with one or more embodiments.

FIG. 1B is a schematic diagram of a semiconductor device 110 in accordance with one or more embodiments. Semiconductor device 110 is an embodiment of semiconductor device 100 shown in FIG. 1A. Semiconductor device 110 includes ROM devices 102A and 102B, ILV 104, Word Lines WL-1 and WL-2, Bit Line BL, drain vias 106A and 106B and source vias 108A and 108B. ROM devices 102A and 102B are positioned on different layers of semiconductor device 110 and are electrically connected by ILV 104. In some embodiments, ROM device 102A is active and portions of ROM device 102B are inactive, e.g., such that ROM device 102B operates as a redundant ROM device. In some embodiments, a redundant ROM device 102B is utilized to overcome a weak bit scenario (described below in FIG. 2A) by activating previously inactive portions of the redundant ROM device 102B, and inactivating previously active portions of the ROM device 102A.

ROM device 102A includes NMOS transistor N10, Word Line WL-1, Bit Line BL, source via 108A and drain via 106A. In some embodiments, ROM device 102A includes PMOS transistors or a combination of PMOS and NMOS transistors. In some embodiments, the transistor devices include planar type and fin-type field-effect transistors (FinFETs).

NMOS transistor N10 includes a gate, drain and source region. The gate region of NMOS transistor N10 is connected to the Word Line WL-1. The gate of the NMOS transistor N10 is selectively switched from "on/off" by Word Line WL-1 based upon the state of Word Line WL-1. In some embodiments, Word Line WL-1 is active. In some embodiments, Word Line WL-1 is inactive. The drain region of NMOS transistor N10 is connected to the Bit Line BL by drain via 106A. The source region of NMOS transistor N10 is connected to ground by source via 108A. The drain region of NMOS transistor N10 is connected to the drain region of NMOS transistor N20 by ILV 104.

ROM device 102B includes NMOS transistor N20, Word Line WL-2, source via 108B and drain via 106B. In some embodiments, ROM device 102B includes PMOS transistors or a combination of PMOS and NMOS transistors. In some embodiments, the transistor devices include planar type and fin-type field-effect transistors (FinFETs).

NMOS transistor N20 includes a gate, drain and source region. The gate region of NMOS transistor N20 is connected to the Word Line WL-2. The gate of the NMOS transistor N20 is selectively switched from "on/off" by Word Line WL-2 based upon the state of Word Line WL-2. In some embodiments, Word Line WL-2 is active. In some embodiments, Word Line WL-2 is inactive. The source region of NMOS transistor N20 is connected to ground by source via 108B. The drain region of NMOS transistor N20 is connected to the Bit Line BL by drain vias 106A and 106B and ILV 104.

Figure 2A:
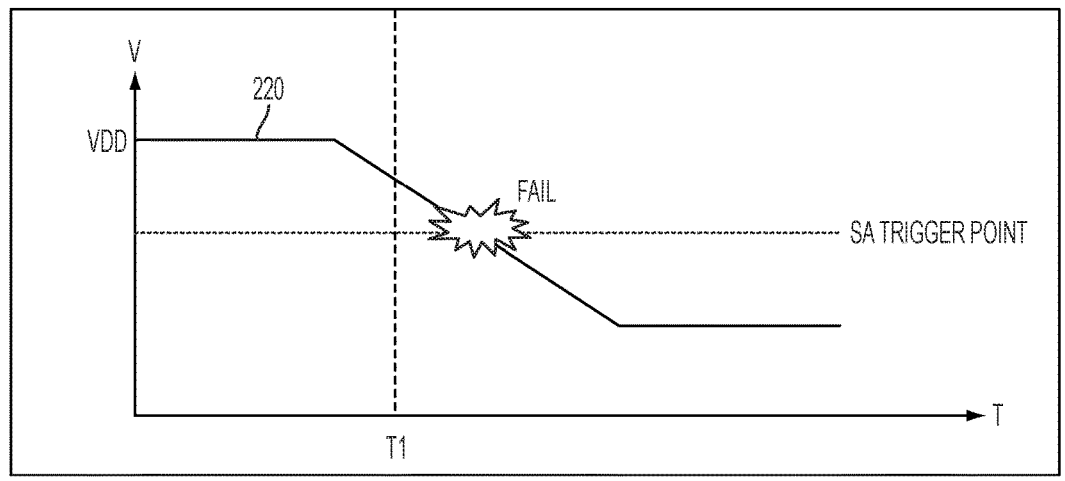
FIG. 2A is a graph of waveforms used to illustrate an operation of the semiconductor device in FIG. 1A, in accordance with one or more embodiments.

FIG. 2A is a graph of timing signals for accessing memory cells in accordance with one or more embodiments. The timing graph depicts a curve of Bit Line signal 220 with time. FIG. 2A is a graph of Bit Line signal 220 from an embodiment of semiconductor device 110 previously described in FIG. 1B when ROM device 102B operates as a redundant ROM device.

In some embodiments, semiconductor device 110 includes ROM device 102A and ROM device 102B. In some embodiments, ROM device 102A is active and portions of ROM device 102B are inactive, e.g., such that ROM device 102B operates as a redundant ROM device. In some embodiments, Word Line WL-1 is in an active state switching "on" the gate of the NMOS transistor N10, and Word Line WL-2 is in an inactive state switching "off" the gate of the NMOS transistor N20. In some embodiments, if Word Line WL-2 is in an inactive state, ROM device 102B operates as a redundant ROM device.

As depicted in FIG. 2A, the Bit Line signal 220 transitions from a higher voltage level VDD to a lower voltage level.

At time T1, the semiconductor device 110 performs a read operation with ROM device 102A and is unsuccessful from a weak bit scenario. A weak bit is a memory cell that, compared with other storage cells, has a relatively low driving current $I_{CELL}$ capability due to process/device variations. In some embodiments, the amount of driving current $I_{CELL}$ controls the discharge rate of the voltage on the Bit Line BL. In some embodiments, if a low memory cell current $I_{CELL}$ is present, the voltage on the Bit Line BL decays slower than expected and reaches the Sense Amplifier (SA) trigger point later in time than expected, resulting in a less accurate read operation. In some embodiments, a redundant ROM device 102B is utilized to overcome the weak bit scenario by activating previously inactive portions of the redundant ROM device 102B (as described in FIG. 2B).

Figure 2B:
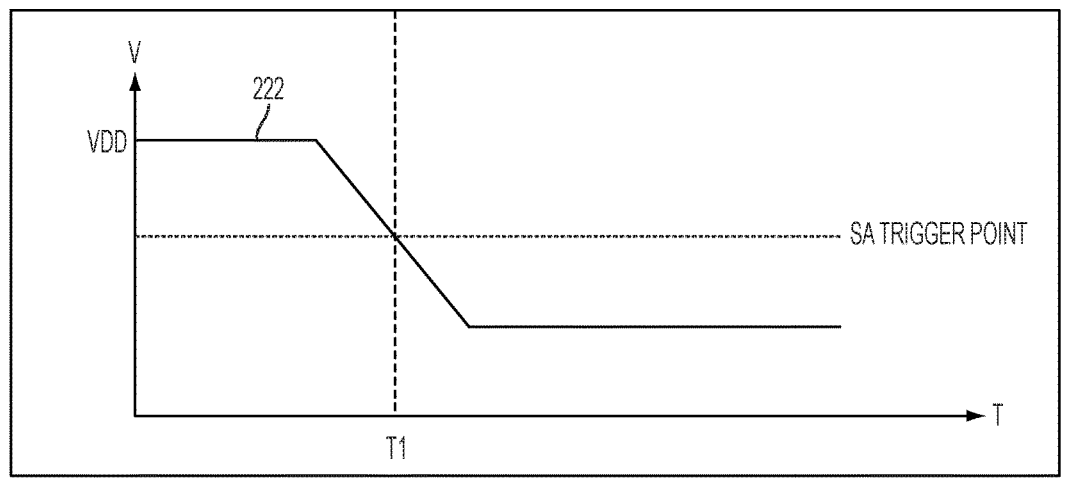
FIG. 2B is a graph of waveforms used to illustrate an operation of the semiconductor device in FIG. 1A, in accordance with one or more embodiments.

FIG. 2B is a graph of timing signals for accessing memory cells in accordance with one or more embodiments. The timing graph depicts a curve of Bit Line signal 222 with time. FIG. 2B is a graph of Bit Line signal 222 from an embodiment of semiconductor device 110 previously described in FIG. 1B when ROM device 102B is utilized to overcome the weak bit scenario of FIG. 2A. In some embodiments, ROM device 102B is utilized such that some previously inactive portions of the redundant ROM device 102B are activated. In some embodiments, Word Line WL-1 is in an active state switching "on" the gate of the NMOS transistor N10, and Word Line WL-2 is in an active state switching "on" the gate of the NMOS transistor N20. In some embodiments, Word Line WL-1 is in an inactive state switching "off" the gate of the NMOS transistor N10, and Word Line WL-2 is in an active state switching "on" the gate of the NMOS transistor N20.

As depicted in FIG. 2B, the Bit Line signal 222 transitions from a higher voltage level VDD to a lower voltage level.

At time T1, the semiconductor device 110 performs a read operation with ROM device 102B and is successful since the driving current $I_{CELL}$ is large enough to result in the voltage on the Bit Line BL reaching the SA trigger point as expected. As can be seen from FIG. 2B, the Word Line WL-2 is in an active state switching "on" the gate of the NMOS transistor N20 in semiconductor device 110 and overcomes the weak bit scenario described in FIG. 2A and results in more accurate read operations.

Figure 3A:
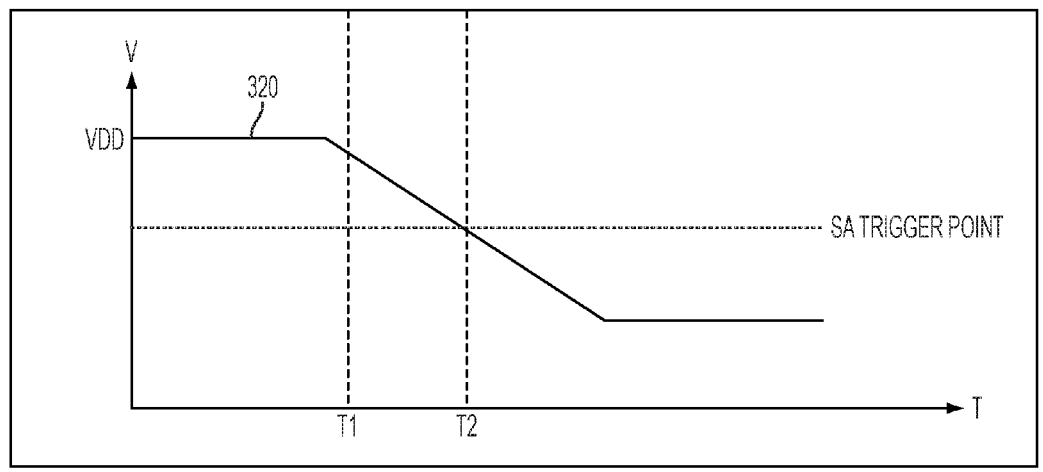
FIG. 3A is a graph of waveforms used to illustrate an operation of the semiconductor device in FIG. 1A, in accordance with one or more embodiments.

FIG. 3A is a graph of timing signals for accessing memory cells in accordance with one or more embodiments. The timing graph depicts a curve of Bit Line signal 320 with time. FIG. 3A is a graph of Bit Line signal 320 from an embodiment of semiconductor device 110 previously described in FIG. 1B when ROM device 102B operates as a redundant ROM device.

In some embodiments, semiconductor device 110 includes ROM device 102A and ROM device 102B. In some embodiments, ROM device 102A is active and portions of ROM device 102B are inactive, e.g., such that ROM device 102B operates as a redundant ROM device. In some embodiments, Word Line WL-1 is in an active state switching "on" the gate of the NMOS transistor N10, and Word Line WL-2 is in an inactive state switching "off" the gate of the NMOS transistor N20. In some embodiments, if Word Line WL-2 is in an inactive state, ROM device 102B operates as a redundant ROM device.

As depicted in FIG. 3A, the Bit Line signal 320 transitions from a higher voltage level VDD to a lower voltage level.

At time T1, the Bit Line signal 320 continues transitioning from a higher voltage level VDD to a lower voltage level.

At time T2, the semiconductor device 110 performs a read operation with ROM device 102A and is successful since the driving current $I_{CELL}$ is large enough to result in the voltage on the Bit Line BL reaching the SA trigger point as expected.

Figure 3B:
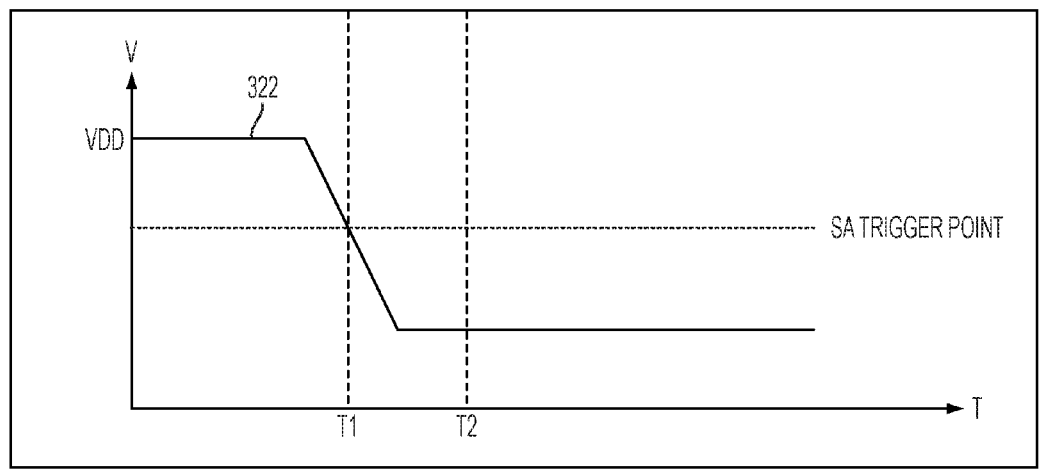
FIG. 3B is a graph of waveforms used to illustrate an operation of the semiconductor device in FIG. 1A, in accordance with one or more embodiments.

FIG. 3B is a graph of timing signals for accessing memory cells in accordance with one or more embodiments. The timing graph depicts a curve of Bit Line signal 322 with time. FIG. 3B is a graph of Bit Line signal 322 from an embodiment of semiconductor device 110 previously described in FIG. 1B when ROM devices 102A and 102B operate in a turbo-mode operation. In some embodiments, ROM devices 102A and 102B are utilized such that some previously inactive portions of the redundant ROM device 102B are activated. In some embodiments, Word Line WL-1 is in an active state switching "on" the gate of the NMOS transistor N10, and Word Line WL-2 is in an active state switching "on" the gate of the NMOS transistor N20. In some embodiments, if Word Line WL-2 is in an active state, ROM device 102B does not operate as a redundant ROM device.

As depicted in FIG. 3B, the Bit Line signal 322 transitions from a higher voltage level VDD to a lower voltage level.

At time T1, the Bit Line signal 322 continues transitioning from a higher voltage level VDD to a lower voltage level.

At time T2, the semiconductor device 110 performs a read operation with ROM devices 102A and 102B and is successful since the driving current $I_{CELL}$ is large enough to result in the voltage on the Bit Line BL reaching the SA trigger point as expected. In some embodiments, the amount of driving current $I_{CELL}$ controls the discharge rate of the voltage on the Bit Line BL. In some embodiments, if a memory cell current $I_{CELL}$ is increased, the voltage on the Bit Line BL decays faster and reaches the SA trigger point earlier in time than that shown by FIG. 3A, resulting in a faster read operation.

Figure 4B:
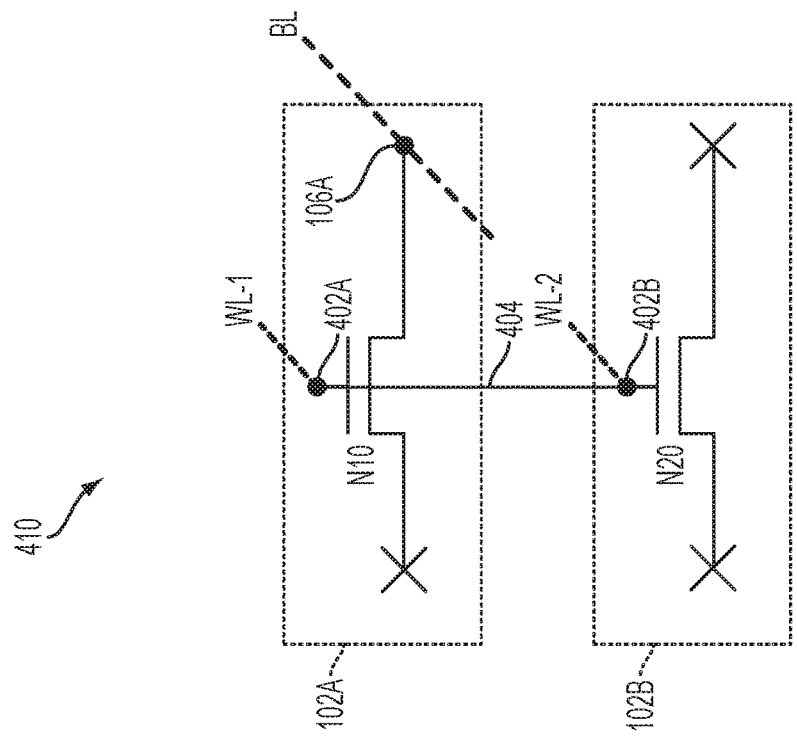
FIG. 4B is a schematic diagram of a semiconductor device in accordance with one or more embodiments.
Figure 4A:
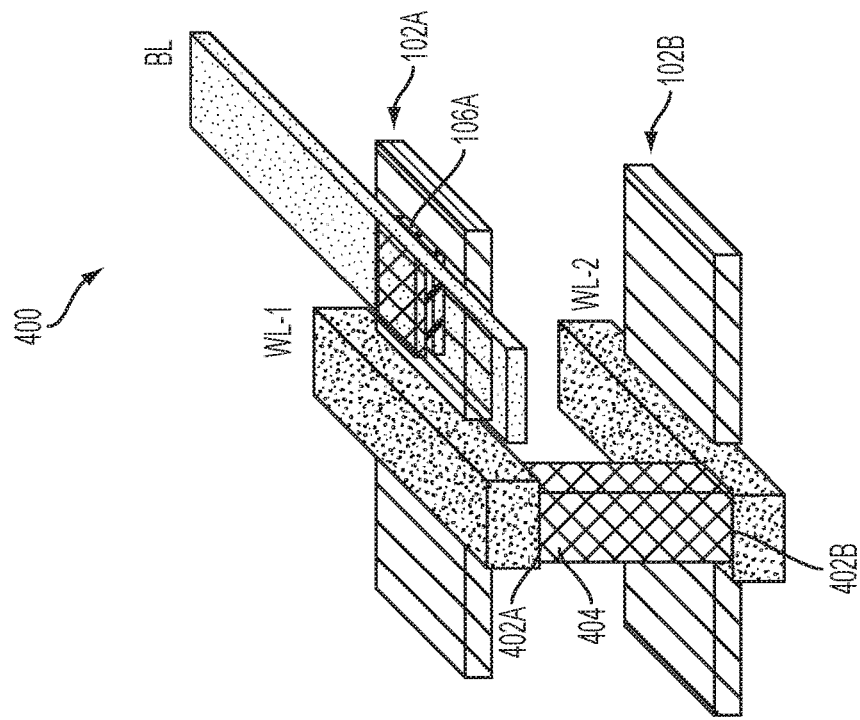
FIG. 4A is a perspective view of a semiconductor device in accordance with one or more embodiments.
Figure 8:
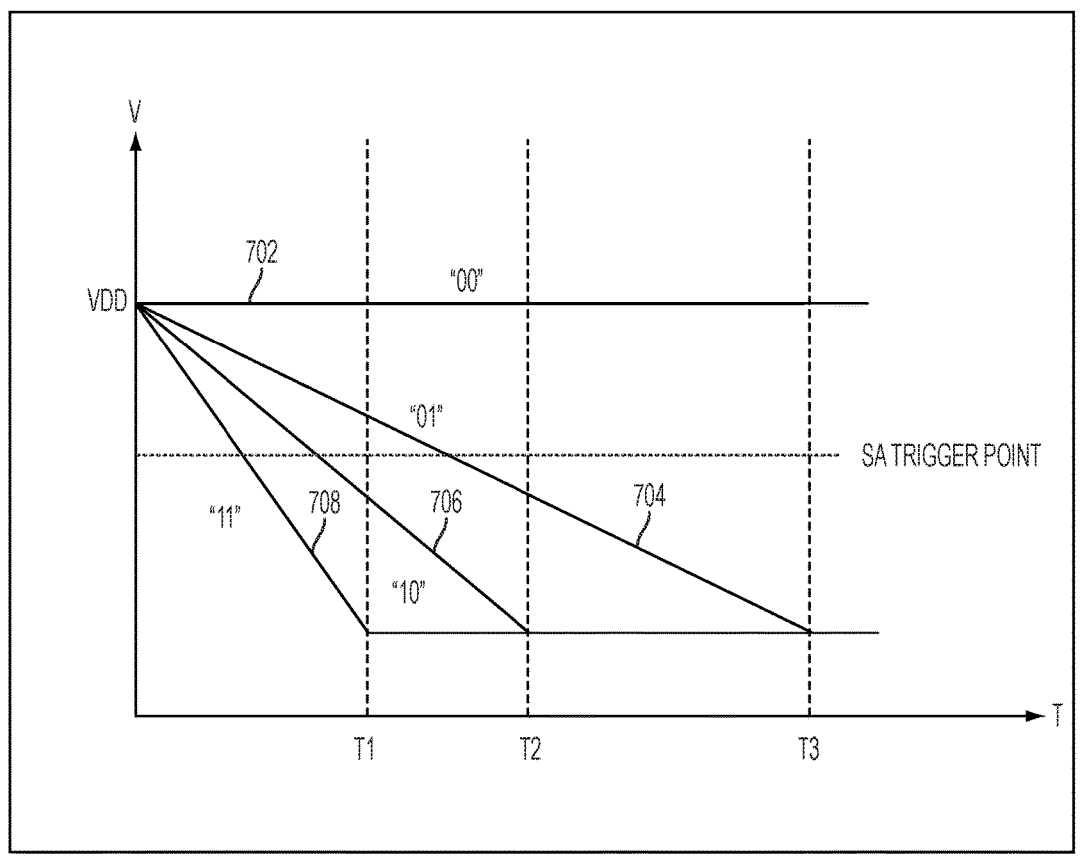
FIG. 8 is a graph of waveforms used to illustrate an operation of the semiconductor devices in FIGS. 4A, 5A, 6A, and 7A in accordance with one or more embodiments.

FIG. 4A is a perspective view of a semiconductor device 400 including a 3D structure in accordance with one or more embodiments. Semiconductor device 400 is an embodiment of semiconductor device 100 shown in FIG. 1A. The semiconductor device 400 includes ROM devices 102A and 102B, drain via 106A, ILV 404, Word Lines WL-1 and WL-2, Bit Line BL and gate nodes 402A and 402B. In some embodiments, semiconductor device 400 operates as a 2 bit ROM device. In some embodiments, ROM devices 102A and 102B operate as a 2 bit ROM device capable of decoding 4 different states. In some embodiments, ROM devices 102A and 102B decode a "00" state, if the driving current $I_{CELL}$ is very small such that the voltage on the Bit Line BL does not discharge or change states (as shown in FIG. 8).

ROM devices 102A and 102B are positioned on different layers of semiconductor device 100 and are electrically connected by ILV 404. In some embodiments, ROM devices 102A and 102B are separated from each other by at least an ILD or a substrate. In some embodiments, the ILD ranges from about 30 nm to about 140 nm. Each of the ROM devices 102A, 102B includes NMOS transistors N10 and N20 (shown in FIG. 4B). In some embodiments, ROM devices 102A and 102B include PMOS transistors or a combination of PMOS and NMOS transistors. Each of the NMOS transistors N10 and N20 (shown in FIG. 4B) includes a gate, drain and source region. In some embodiments, the transistor devices include planar type and fin-type field-effect transistors (FinFETs). In some embodiments, planar-type transistor devices are separated from each other on different layers by an ILD thickness which ranges from about 110 nm to about 140 nm. In some embodiments, FinFET transistor devices are separated from each other on different layers by an ILD thickness which ranges from about 50 nm to about 75 nm.

ROM device 102A includes drain via 106A, Word Line WL-1 and Bit Line BL. In some embodiments, Word Line WL-1 and Bit Line BL are parallel with each other. In some embodiments, Word Line WL-1 and Bit Line BL are perpendicular with each other. Word Line WL-1 is connected to the gate region of ROM Device 102A. The gate region of ROM device 102A is connected to the gate region of ROM device 102B by ILV 404. In some embodiments, the gate region of ROM device 102A is connected to the gate region of ROM device 102B by ILV 404 and Word Lines WL-1 and WL-2. Word Line WL-1 is connected to ILV 404 at gate node 402A. In some embodiments, ILV 404 has a diameter which ranges from about 65 nm to about 75 nm. In some embodiments, ILV 404 has a diameter which ranges from about 10.5 nm to about 11.5 nm. In some embodiments, the height of ILV 404 ranges from about 75 nm to about 140 nm. In at least some embodiments, the shape of ILV 404 is circular, rectangular, square, hexagonal, or includes other geometric shapes.

Bit Line BL is connected to the drain region of ROM device 102A by drain via 106A. In some embodiments, drain via 106A connects the drain region of ROM device 102A to other metallization layers within semiconductor device 400.

ROM device 102B includes Word Line WL-2. In some embodiments, Word Line WL-1 and Word Line WL-2 are parallel with each other. In some embodiments, Word Line WL-1 and Word Line WL-2 are perpendicular with each other. In some embodiments, ROM device 102B includes another bit line (not shown). Word Line WL-2 is connected to the gate region of ROM Device 102B. Word Line WL-2 is connected to ILV 404 at gate node 402B.

FIG. 4B is a schematic diagram of a semiconductor device 410 in accordance with one or more embodiments. Semiconductor device 410 is an embodiment of semiconductor device 400 shown in FIG. 4A. Semiconductor device 410 includes ROM devices 102A and 102B, ILV 404, Word Lines WL-1 and WL-2, Bit Line BL, drain via 106A and gate nodes 402A and 402B. ROM devices 102A and 102B are positioned on different layers of semiconductor device 410 and are electrically connected by ILV 404.

ROM device 102A includes NMOS transistor N10, Word Line WL-1, Bit Line BL, drain via 106A and gate node 402A. In some embodiments, ROM device 102A includes PMOS transistors or a combination of PMOS and NMOS transistors. In some embodiments, the transistor devices include planar type and fin-type field-effect transistors (FinFETs).

NMOS transistor N10 includes a gate, drain and source region. The gate region of NMOS transistor N10 is connected to the Word Line WL-1. The gate of the NMOS transistor N10 is selectively switched from "on/off" by Word Lines WL-1 and WL-2 based upon the state of Word Lines WL-1 and WL-2. In some embodiments, Word Line WL-1 is active. In some embodiments, Word Line WL-1 is inactive. The drain region of NMOS transistor N10 is connected to the Bit Line BL by drain via 106A. In some embodiments, the source region of NMOS transistor N10 is floating. In some embodiments, the source region of NMOS transistor N10 is not connected to other portions of ROM device 102A. Word Line WL-1 is connected to Word Line WL-2. The gate region of NMOS transistor N10 is connected to the gate region of NMOS transistor N20 by ILV 404. Word Line WL-1 is connected to ILV 404 at gate node 402A.

ROM device 102B includes NMOS transistor N20, Word Line WL-2 and gate node 402B. In some embodiments, ROM device 102B includes PMOS transistors or a combination of PMOS and NMOS transistors. In some embodiments, the transistor devices include planar type and fin-type field-effect transistors (FinFETs).

NMOS transistor N20 includes a gate, drain and source region. The gate region of NMOS transistor N20 is connected to the Word Line WL-2. Word Line WL-2 is connected to ILV 404 at gate node 402B. The gate of the NMOS transistor N20 is selectively switched from "on/off" by Word Lines WL-1 and WL-2 based upon the state of Word Lines WL-1 and WL-2. In some embodiments, Word Line WL-2 is active. In some embodiments, Word Line WL-2 is inactive. In some embodiments, the source region of NMOS transistor N20 is floating. In some embodiments, the source region of NMOS transistor N20 is not connected to other portions of ROM device 102B. In some embodiments, the drain region of NMOS transistor N20 is floating. In some embodiments, the drain region of NMOS transistor N20 is not connected to other portions of ROM device 102B.

Figure 5B:
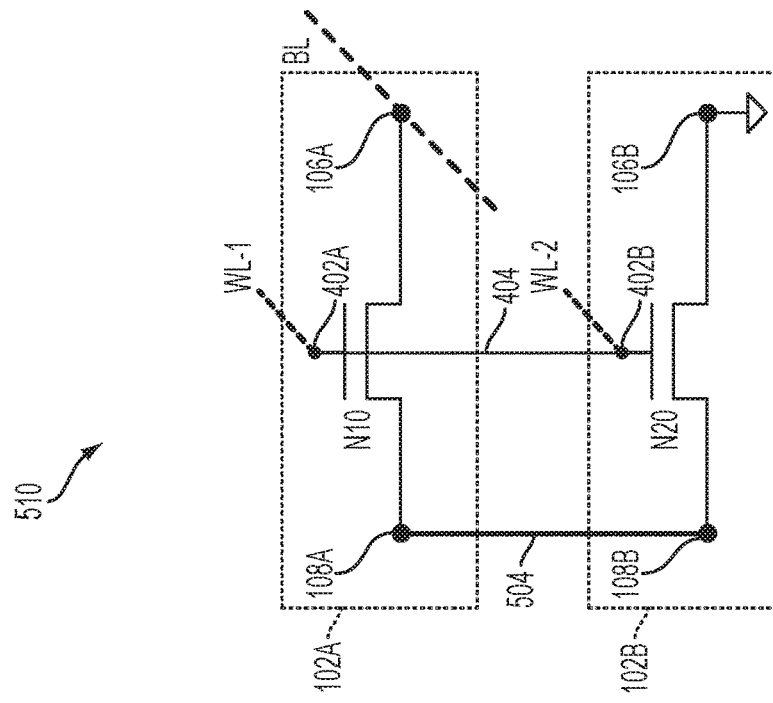
FIG. 5B is a schematic diagram of a semiconductor device in accordance with one or more embodiments.
Figure 5A:
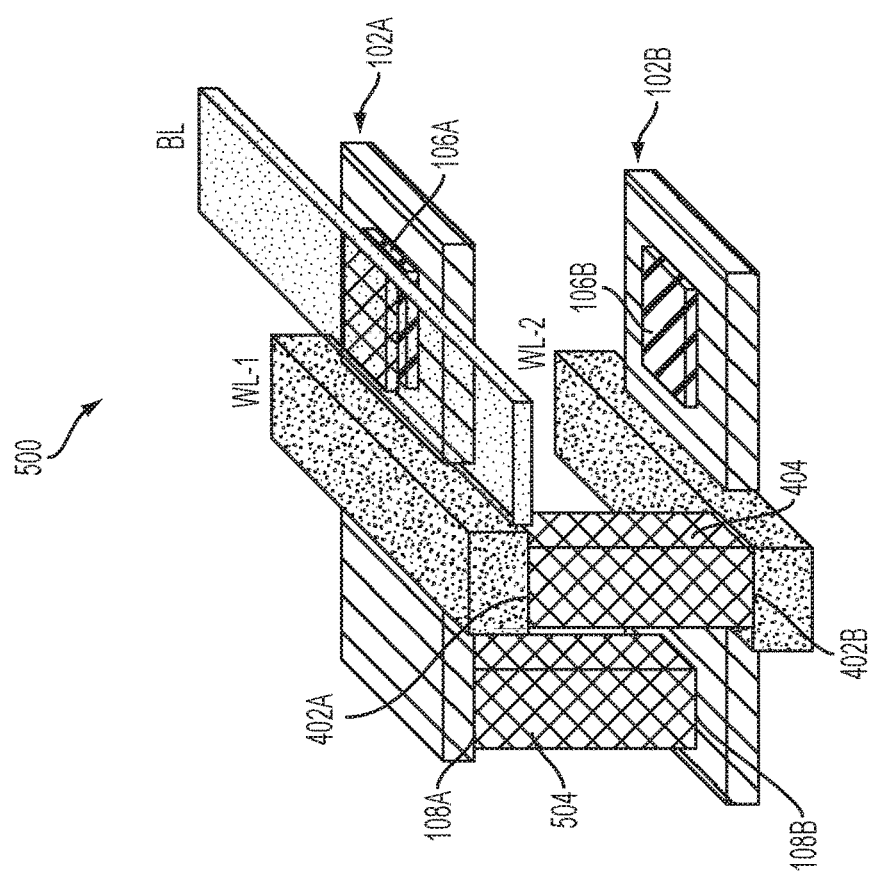
FIG. 5A is a perspective view of a semiconductor device in accordance with one or more embodiments.

FIG. 5A is a perspective view of a semiconductor device 500 including a 3D structure in accordance with one or more embodiments. Semiconductor device 500 is an embodiment of semiconductor device 100 shown in FIG. 1A. The semiconductor device 500 includes ROM devices 102A and 102B, drain vias 106A and 106B, ILV 404, ILV 504, Word Lines WL-1 and WL-2, Bit Line BL, gate nodes 402A and 402B, and source vias 108A and 108B. In some embodiments, semiconductor device 500 operates as a 2 bit ROM device. In some embodiments, ROM devices 102A and 102B operate as a 2 bit ROM device capable of decoding 4 different states. In some embodiments, ROM devices 102A and 102B decode a "01" state, if the driving current $I_{CELL}$ is sufficient to result in the voltage on the Bit Line BL discharging or changing states (as shown in FIG. 8). In some embodiments, ROM devices 102A and 102B operate in a series configuration.

ROM devices 102A and 102B are positioned on different layers of semiconductor device 100 and are electrically connected by ILV 404 and ILV 504. In some embodiments, ROM devices 102A and 102B are separated from each other by at least an ILD or a substrate. In some embodiments, the ILD ranges from about 30 nm to about 140 nm. Each of the ROM devices 102A, 102B includes NMOS transistors N10 and N20 (shown in FIG. 5B). In some embodiments, ROM devices 102A and 102B include PMOS transistors or a combination of PMOS and NMOS transistors. Each of the NMOS transistors N10 and N20 (shown in FIG. 5B) includes a gate, drain and source region. In some embodiments, the transistor devices include planar type and fin-type field-effect transistors (FinFETs). In some embodiments, planar-type transistor devices are separated from each other on different layers by an ILD thickness which ranges from about 110 nm to about 140 nm. In some embodiments, FinFET transistor devices are separated from each other on different layers by an ILD thickness which ranges from about 50 nm to about 75 nm.

ROM device 102A includes drain via 106A, source via 108A, Word Line WL-1 and Bit Line BL. In some embodiments, Word Line WL-1 and Bit Line BL are parallel with each other. In some embodiments, Word Line WL-1 and Bit Line BL are perpendicular with each other. Word Line WL-1 is connected to the gate region of ROM Device 102A. Drain via 106A is connected to the drain region of ROM device 102A. In some embodiments, drain via 106A connects the drain region of ROM device 102A to other metallization layers within semiconductor device 500. Source via 108A is connected to the source region of ROM device 102A. In some embodiments, source via 108A connects the source region of ROM device 102A to other metallization layers within semiconductor device 500. The gate region of ROM device 102A is connected to the gate region of ROM device 102B by ILV 404. In some embodiments, the gate region of ROM device 102A is connected to the gate region of ROM device 102B by ILV 404 and Word Lines WL-1 and WL-2. Word Line WL-1 is connected to ILV 404 at gate node 402A. In some embodiments, ILV 404 has a diameter which ranges from about 65 nm to about 75 nm. In some embodiments, ILV 404 has a diameter which ranges from about 10.5 nm to about 11.5 nm. In some embodiments, the height of ILV 404 ranges from about 75 nm to about 140 nm. In at least some embodiments, the shape of ILV 404 is circular, rectangular, square, hexagonal, or includes other geometric shapes. The source region of ROM device 102A is connected to the source region of ROM device 102B by ILV 504. In some embodiments, the source region of ROM device 102A is connected to the source region of ROM device 102B by ILV 504 and source vias 108A and 108B. In some embodiments, ILV 504 has a diameter which ranges from about 65 nm to about 75 nm. In some embodiments, ILV 504 has a diameter which ranges from about 10.5 nm to about 11.5 nm. In some embodiments, the height of ILV 504 ranges from about 75 nm to about 140 nm. In at least some embodiments, the shape of ILV 504 is circular, rectangular, square, hexagonal, or includes other geometric shapes.

Bit Line BL is connected to the drain region of ROM device 102A by drain via 106A. In some embodiments, drain via 106A connects the drain region of ROM device 102A to other metallization layers within semiconductor device 500.

ROM device 102B includes Word Line WL-2, source via 108B and drain via 106B. In some embodiments, Word Line WL-1 and Word Line WL-2 are parallel with each other. In some embodiments, Word Line WL-1 and Word Line WL-2 are perpendicular with each other. In some embodiments, ROM device 102B includes another bit line (not shown). Drain via 106B is connected to the drain region of ROM device 102B. In some embodiments, drain via 106B connects the drain region of ROM device 102B to other metallization layers within semiconductor device 500. The source region of ROM device 102B is connected to ILV 504 by source via 108B. Source via 108B is connected to the source region of ROM device 102B. In some embodiments, source via 108B connects the source region of ROM device 102B to other metallization layers within semiconductor device 500. Word Line WL-2 is connected to the gate region of ROM Device 102B. Word Line WL-2 is connected to ILV 404 at gate node 402B.

FIG. 5B is a schematic diagram of a semiconductor device 510 in accordance with one or more embodiments. Semiconductor device 510 is an embodiment of semiconductor device 500 shown in FIG. 5A. Semiconductor device 510 includes ROM devices 102A and 102B, drain vias 106A and 106B, ILV 404, ILV 504, Word Lines WL-1 and WL-2, Bit Line BL, gate nodes 402A and 402B, and source vias 108A and 108B. ROM devices 102A and 102B are positioned on different layers of semiconductor device 510 and are electrically connected by ILV 404 and ILV 504. In some embodiments, ROM devices 102A and 102B operate in a series configuration.

ROM device 102A includes NMOS transistor N10, Word Line WL-1, Bit Line BL, drain via 106A, source via 108A and gate node 402A. In some embodiments, ROM device 102A includes PMOS transistors or a combination of PMOS and NMOS transistors. In some embodiments, the transistor devices include planar type and fin-type field-effect transistors (FinFETs).

NMOS transistor N10 includes a gate, drain and source region. The gate region of NMOS transistor N10 is connected to the Word Line WL-1. The gate of the NMOS transistor N10 is selectively switched from "on/off" by Word Lines WL-1 and WL-2 based upon the state of Word Lines WL-1 and WL-2. In some embodiments, Word Line WL-1 is active. In some embodiments, Word Line WL-1 is inactive. The drain region of NMOS transistor N10 is connected to the Bit Line BL by drain via 106A. The gate region of NMOS transistor N10 is connected to the gate region of NMOS transistor N20 by ILV 404. Word Line WL-1 is connected to ILV 404 at gate node 402A. The source region of NMOS transistor N10 is connected to the source region of NMOS transistor N20 by ILV 504. The source region of NMOS transistor N10 is connected to the ILV 504 by source via 108A. In some embodiments, NMOS transistor N10 operates in a series configuration with NMOS transistor N20.

ROM device 102B includes NMOS transistor N20, Word Line WL-2, drain via 106B, source via 108B and gate node 402B. In some embodiments, ROM device 102B includes PMOS transistors or a combination of PMOS and NMOS transistors. In some embodiments, the transistor devices include planar type and fin-type field-effect transistors (FinFETs).

NMOS transistor N20 includes a gate, drain and source region. The gate region of NMOS transistor N20 is connected to the Word Line WL-2. Word Line WL-2 is connected to ILV 404 at gate node 402B. The gate of the NMOS transistor N20 is selectively switched from "on/off" by Word Lines WL-1 and WL-2 based upon the state of Word Lines WL-1 and WL-2. In some embodiments, Word Line WL-2 is active. In some embodiments, Word Line WL-2 is inactive. The source region of NMOS transistor N20 is connected to the ILV 504 by source via 108B. The drain region of NMOS transistor N20 is connected to ground by drain via 106B. In some embodiments, drain via 106B connects the drain region of ROM device 102B to other metallization layers within semiconductor device 510.

Figure 6B:
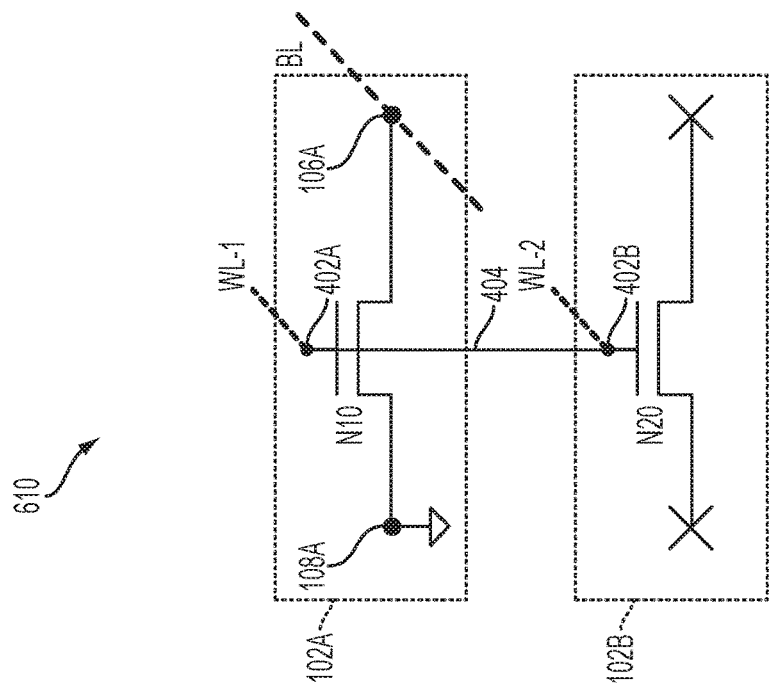
FIG. 6B is a schematic diagram of a semiconductor device in accordance with one or more embodiments.
Figure 6A:
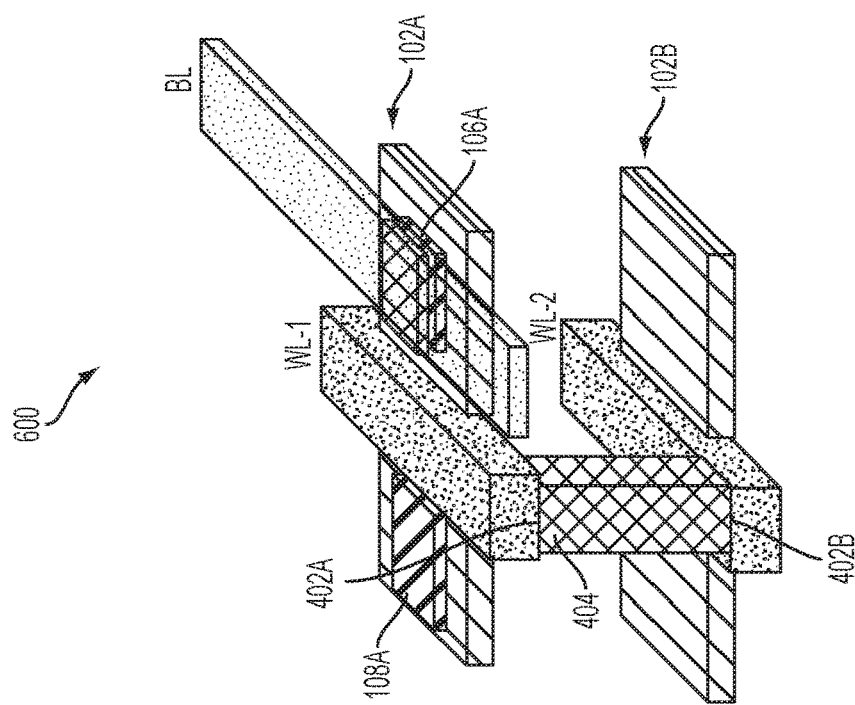
FIG. 6A is a perspective view of a semiconductor device in accordance with one or more embodiments.

FIG. 6A is a perspective view of a semiconductor device 600 including a 3D structure in accordance with one or more embodiments. Semiconductor device 600 is an embodiment of semiconductor device 100 shown in FIG. 1A. The semiconductor device 600 includes ROM devices 102A and 102B, drain via 106A, source via 108A, ILV 404, Word Lines WL-1 and WL-2, Bit Line BL and gate nodes 402A and 402B. In some embodiments, semiconductor device 600 operates as a 2 bit ROM device. In some embodiments, ROM devices 102A and 102B operate as a 2 bit ROM device capable of decoding 4 different states. In some embodiments, ROM devices 102A and 102B decode a "10" state, if the driving current $I_{CELL}$ is sufficient to result in the voltage on the Bit Line BL discharging or changing states (as shown in FIG. 8).

ROM devices 102A and 102B are positioned on different layers of semiconductor device 100 and are electrically connected by ILV 404. In some embodiments, ROM devices 102A and 102B are separated from each other by at least an ILD or a substrate. In some embodiments, the ILD ranges from about 30 nm to about 140 nm. Each of the ROM devices 102A, 102B includes NMOS transistors N10 and N20 (shown in FIG. 6B). In some embodiments, ROM devices 102A and 102B include PMOS transistors or a combination of PMOS and NMOS transistors. Each of the NMOS transistors N10 and N20 (shown in FIG. 6B) includes a gate, drain and source region. In some embodiments, the transistor devices include planar type and fin-type field-effect transistors (FinFETs). In some embodiments, planar-type transistor devices are separated from each other on different layers by an ILD thickness which ranges from about 110 nm to about 140 nm. In some embodiments, FinFET transistor devices are separated from each other on different layers by an ILD thickness which ranges from about 50 nm to about 75 nm.

ROM device 102A includes drain via 106A, source via 108A, Word Line WL-1 and Bit Line BL. In some embodiments, Word Line WL-1 and Bit Line BL are parallel with each other. In some embodiments, Word Line WL-1 and Bit Line BL are perpendicular with each other. Word Line WL-1 is connected to the gate region of ROM Device 102A. The gate region of ROM device 102A is connected to the gate region of ROM device 102B by ILV 404. In some embodiments, the gate region of ROM device 102A is connected to the gate region of ROM device 102B by ILV 404 and Word Lines WL-1 and WL-2. Word Line WL-1 is connected to ILV 404 at gate node 402A. In some embodiments, ILV 404 has a diameter which ranges from about 65 nm to about 75 nm. In some embodiments, ILV 404 has a diameter which ranges from about 10.5 nm to about 11.5 nm. In some embodiments, the height of ILV 404 ranges from about 75 nm to about 140 nm. In at least some embodiments, the shape of ILV 404 is circular, rectangular, square, hexagonal, or includes other geometric shapes. Source via 108A is connected to the source region of ROM device 102A. In some embodiments, source via 108A connects the source region of ROM device 102A to other metallization layers within semiconductor device 600.

Bit Line BL is connected to the drain region of ROM device 102A by drain via 106A. In some embodiments, drain via 106A connects the drain region of ROM device 102A to other metallization layers within semiconductor device 400.

ROM device 102B includes Word Line WL-2. In some embodiments, Word Line WL-1 and Word Line WL-2 are parallel with each other. In some embodiments, Word Line WL-1 and Word Line WL-2 are perpendicular with each other. In some embodiments, ROM device 102B includes another bit line (not shown). Word Line WL-2 is connected to the gate region of ROM Device 102B. Word Line WL-2 is connected to ILV 404 at gate node 402B.

FIG. 6B is a schematic diagram of a semiconductor device 610 in accordance with one or more embodiments. Semiconductor device 610 is an embodiment of semiconductor device 600 shown in FIG. 6A. Semiconductor device 610 includes ROM devices 102A and 102B, ILV 404, Word Lines WL-1 and WL-2, Bit Line BL, drain via 106A, source via 108A and gate nodes 402A and 402B. ROM devices 102A and 102B are positioned on different layers of semiconductor device 610 and are electrically connected by ILV 404.

ROM device 102A includes NMOS transistor N10, Word Line WL-1, Bit Line BL, drain via 106A, source via 108A and gate node 402A. In some embodiments, ROM device 102A includes PMOS transistors or a combination of PMOS and NMOS transistors. In some embodiments, the transistor devices include planar type and fin-type field-effect transistors (FinFETs).

NMOS transistor N10 includes a gate, drain and source region. The gate region of NMOS transistor N10 is connected to the Word Line WL-1. The gate of the NMOS transistor N10 is selectively switched from "on/off" by Word Lines WL-1 and WL-2 based upon the state of Word Lines WL-1 and WL-2. In some embodiments, Word Line WL-1 is active. In some embodiments, Word Line WL-1 is inactive. The drain region of NMOS transistor N10 is connected to the Bit Line BL by drain via 106A. The gate region of NMOS transistor N10 is connected to the gate region of NMOS transistor N20 by ILV 404. Word Line WL-1 is connected to ILV 404 at gate node 402A. The source region of NMOS transistor N10 is connected to ground by source via 108A.

ROM device 102B includes NMOS transistor N20, Word Line WL-2 and gate node 402B. In some embodiments, ROM device 102B includes PMOS transistors or a combination of PMOS and NMOS transistors. In some embodiments, the transistor devices include planar type and fin-type field-effect transistors (FinFETs).

NMOS transistor N20 includes a gate, drain and source region. The gate region of NMOS transistor N20 is connected to the Word Line WL-2. Word Line WL-2 is connected to ILV 404 at gate node 402B. The gate of the NMOS transistor N20 is selectively switched from "on/off" by Word Lines WL-1 and WL-2 based upon the state of Word Lines WL-1 and WL-2. In some embodiments, Word Line WL-2 is active. In some embodiments, Word Line WL-2 is inactive. In some embodiments, the source region of NMOS transistor N20 is floating. In some embodiments, the source region of NMOS transistor N20 is not connected to other portions of ROM device 102B. In some embodiments, the drain region of NMOS transistor N20 is floating. In some embodiments, the drain region of NMOS transistor N20 is not connected to other portions of ROM device 102B.

FIG. 7A is a perspective view of a semiconductor device 700 including a 3D structure in accordance with one or more embodiments. Semiconductor device 700 is an embodiment of semiconductor device 100 shown in FIG. 1A. The semiconductor device 700 includes ROM devices 102A and 102B, drain vias 106A and 106B, ILV 104, ILV 404, Word Lines WL-1 and WL-2, Bit Line BL, gate nodes 402A and 402B, and source vias 108A and 108B. In some embodiments, semiconductor device 700 operates as a 2 bit ROM device. In some embodiments, ROM devices 102A and 102B operate as a 2 bit ROM device capable of decoding 4 different states. In some embodiments, ROM devices 102A and 102B decode a "11" state, if the driving current $I_{CELL}$ is sufficient to result in the voltage on the Bit Line BL discharging or changing states (as shown in FIG. 8). In some embodiments, ROM devices 102A and 102B operate in a parallel configuration.

ROM devices 102A and 102B are positioned on different layers of semiconductor device 100 and are electrically connected by ILV 104 and ILV 404. In some embodiments, ROM devices 102A and 102B are separated from each other by at least an ILD or a substrate. In some embodiments, the ILD ranges from about 30 nm to about 140 nm. Each of the ROM devices 102A, 102B includes NMOS transistors N10 and N20 (shown in FIG. 7B). In some embodiments, ROM devices 102A and 102B include PMOS transistors or a combination of PMOS and NMOS transistors. Each of the NMOS transistors N10 and N20 (shown in FIG. 7B) includes a gate, drain and source region. In some embodiments, the transistor devices include planar type and fin-type field-effect transistors (FinFETs). In some embodiments, planar-type transistor devices are separated from each other on different layers by an ILD thickness which ranges from about 110 nm to about 140 nm. In some embodiments, FinFET transistor devices are separated from each other on different layers by an ILD thickness which ranges from about 50 nm to about 75 nm.

ROM device 102A includes drain via 106A, source via 108A, Word Line WL-1 and Bit Line BL. In some embodiments, Word Line WL-1 and Bit Line BL are parallel with each other. In some embodiments, Word Line WL-1 and Bit Line BL are perpendicular with each other. Word Line WL-1 is connected to the gate region of ROM Device 102A. The drain region of ROM device 102A is connected to the drain region of ROM device 102B by ILV 104. In some embodiments, the drain region of ROM device 102A is connected to the drain region of ROM device 102B by ILV 104 and drain vias 106A and 106B. In some embodiments, ILV 104 has a diameter which ranges from about 65 nm to about 75 nm. In some embodiments, ILV 104 has a diameter which ranges from about 10.5 nm to about 11.5 nm. In some embodiments, the height of ILV 104 ranges from about 75 nm to about 140 nm. In at least some embodiments, the shape of ILV 104 is circular, rectangular, square, hexagonal, or includes other geometric shapes. Drain via 106A is connected to the drain region of ROM device 102A. In some embodiments, drain via 106A connects the drain region of ROM device 102A to other metallization layers within semiconductor device 700. Source via 108A is connected to the source region of ROM device 102A. In some embodiments, source via 108A connects the source region of ROM device 102A to other metallization layers within semiconductor device 700. The gate region of ROM device 102A is connected to the gate region of ROM device 102B by ILV 404. In some embodiments, the gate region of ROM device 102A is connected to the gate region of ROM device 102B by ILV 404 and Word Lines WL-1 and WL-2. Word Line WL-1 is connected to ILV 404 at gate node 402A. In some embodiments, ILV 404 has a diameter which ranges from about 65 nm to about 75 nm. In some embodiments, ILV 404 has a diameter which ranges from about 10.5 nm to about 11.5 nm. In some embodiments, the height of ILV 404 ranges from about 75 nm to about 140 nm. In at least some embodiments, the shape of ILV 404 is circular, rectangular, square, hexagonal, or includes other geometric shapes.

Bit Line BL is connected to the drain region of ROM device 102A by drain via 106A. In some embodiments, drain via 106A connects the drain region of ROM device 102A to other metallization layers within semiconductor device 700.

ROM device 102B includes Word Line WL-2, source via 108B and drain via 106B. In some embodiments, Word Line WL-1 and Word Line WL-2 are parallel with each other. In some embodiments, Word Line WL-1 and Word Line WL-2 are perpendicular with each other. In some embodiments, ROM device 102B includes another bit line (not shown). Drain via 106B is connected to the drain region of ROM device 102B. Drain via 106B is connected to the ILV 104. In some embodiments, drain via 106B connects the drain region of ROM device 102B to other metallization layers within semiconductor device 700. Source via 108B is connected to the source region of ROM device 102B. In some embodiments, source via 108B connects the source region of ROM device 102B to other metallization layers within semiconductor device 700. Word Line WL-2 is connected to the gate region of ROM Device 102B. Word Line WL-2 is connected to ILV 404 at gate node 402B.

FIG. 7B is a schematic diagram of a semiconductor device 710 in accordance with one or more embodiments. Semiconductor device 710 is an embodiment of semiconductor device 700 shown in FIG. 7A. Semiconductor device 710 includes ROM devices 102A and 102B, drain vias 106A and 106B, ILV 104, ILV 404, Word Lines WL-1 and WL-2, Bit Line BL, gate nodes 402A and 402B, and source vias 108A and 108B. ROM devices 102A and 102B are positioned on different layers of semiconductor device 710 and are electrically connected by ILV 104 and ILV 404. In some embodiments, ROM devices 102A and 102B operate in a parallel configuration.

ROM device 102A includes NMOS transistor N10, Word Line WL-1, Bit Line BL, drain via 106A, source via 108A and gate node 402A. In some embodiments, ROM device 102A includes PMOS transistors or a combination of PMOS and NMOS transistors. In some embodiments, the transistor devices include planar type and fin-type field-effect transistors (FinFETs).

NMOS transistor N10 includes a gate, drain and source region. The gate region of NMOS transistor N10 is connected to the Word Line WL-1. The gate of the NMOS transistor N10 is selectively switched from "on/off" by Word Lines WL-1 and WL-2 based upon the state of Word Lines WL-1 and WL-2. In some embodiments, Word Line WL-1 is active. In some embodiments, Word Line WL-1 is inactive. The drain region of NMOS transistor N10 is connected to the Bit Line BL by drain via 106A. The gate region of NMOS transistor N10 is connected to the gate region of NMOS transistor N20 by ILV 404. Word Line WL-1 is connected to ILV 404 at gate node 402A. The drain region of NMOS transistor N10 is connected to the drain region of NMOS transistor N20 by ILV 104. The drain region of NMOS transistor N10 is connected to the ILV 104 by drain via 106A. The source region of NMOS transistor N10 is connected to ground by source via 108A. In some embodiments, source via 108A connects the source region of ROM device 102B to other metallization layers within semiconductor device 710. In some embodiments, NMOS transistor N10 operates in a parallel configuration with NMOS transistor N20.

ROM device 102B includes NMOS transistor N20, Word Line WL-2, drain via 106B, source via 108B and gate node 402B. In some embodiments, ROM device 102B includes PMOS transistors or a combination of PMOS and NMOS transistors. In some embodiments, the transistor devices include planar type and fin-type field-effect transistors (FinFETs).

NMOS transistor N20 includes a gate, drain and source region. The gate region of NMOS transistor N20 is connected to the Word Line WL-2. Word Line WL-2 is connected to ILV 404 at gate node 402B. The gate of the NMOS transistor N20 is selectively switched from "on/off" by Word Lines WL-1 and WL-2 based upon the state of Word Lines WL-1 and WL-2. In some embodiments, Word Line WL-2 is active. In some embodiments, Word Line WL-2 is inactive. The drain region of NMOS transistor N20 is connected to the ILV 104 by drain via 106B. The source region of NMOS transistor N20 is connected to ground by source via 108B. In some embodiments, source via 108B connects the source region of ROM device 102B to other metallization layers within semiconductor device 710.

FIG. 8 is a graph of timing signals for accessing memory cells in accordance with one or more embodiments. The timing graph depicts a curve of Bit Line signals 702, 704, 706 and 708 with time. Bit Line signal 702 is a curve from an embodiment of semiconductor device 400 previously described in FIGS. 4A and 4B when ROM devices 102A and 102B operate as a double bit ROM device. Bit Line signal 704 is a curve from an embodiment of semiconductor device 500 previously described in FIGS. 5A and 5B when ROM devices 102A and 102B operate as a double bit ROM device. Bit Line signal 706 is a curve from an embodiment of semiconductor device 600 previously described in FIGS. 6A and 6B when ROM devices 102A and 102B operate as a double bit ROM device. Bit Line signal 708 is a curve from an embodiment of semiconductor device 700 previously described in FIGS. 7A and 7B when ROM devices 102A and 102B operate as a double bit ROM device.

In some embodiments, semiconductor devices 400, 500, 600 and 700 operate as a 2 bit ROM device. In some embodiments, ROM devices 102A and 102B operate as a 2 bit ROM device capable of decoding 4 different states. In some embodiments, semiconductor device 400 decodes a "00" state, if the driving current $I_{CELL}$ is very small such that the voltage on the Bit Line BL does not discharge or change states. In some embodiments, semiconductor device 500 decodes a "01" state, if the driving current $I_{CELL}$ is sufficient to result in the voltage on the Bit Line BL discharging or changing states. In some embodiments, the ROM devices 102A and 102B of semiconductor device 500 operate in a series configuration. In some embodiments, semiconductor device 600 decodes a "10" state, if the driving current $I_{CELL}$ is sufficient to result in the voltage on the Bit Line BL discharging or changing states. In some embodiments, semiconductor device 700 decodes a "11" state, if the driving current $I_{CELL}$ is sufficient to result in the voltage on the Bit Line BL discharging or changing states. In some embodiments, the ROM devices 102A and 102B of semiconductor device 700 operate in a parallel configuration.

As depicted in FIG. 8, each of the Bit Line signals 704, 706 and 708 transitions from a higher voltage level VDD to a lower voltage level over a duration of time T. The Bit Line signal 704 maintains a level at approximately voltage level VDD over a time period T (including individual time points T1, T2 and T3).

At time T1, each of the Bit Line signals 704 and 706 continue transitioning from a higher voltage level VDD to a lower voltage level over a duration of time T. At time T1, the Bit Line signal 708 reaches a lower voltage level and maintains the lower level over the remaining time period.

At time T2, the Bit Line signal 704 continues transitioning from a higher voltage level VDD to a lower voltage level over a duration of time T. At time T2, the Bit Line signal 706 reaches a lower voltage level and maintains the lower level over the remaining time period.

At time T3, the Bit Line signal 704 reaches a lower voltage level and maintains the lower level over the remaining time period.

In some embodiments, the amount of driving current $I_{CELL}$ controls the discharge rate of the voltage on the Bit Line BL. In some embodiments, if a memory cell current $I_{CELL}$ is increased, the voltage on the Bit Line BL decays faster, resulting in a faster read operation. As shown in FIG. 8, the use of semiconductor devices 400, 500, 600 and 700 illustrate that four different logic states, "00", "01", "10" and "11", can be represented by four different current/voltage signals. In some embodiments, the use of a dual T-MI ROM structure doubles the storage capacity in a ROM device over the same area.

Figure 9:
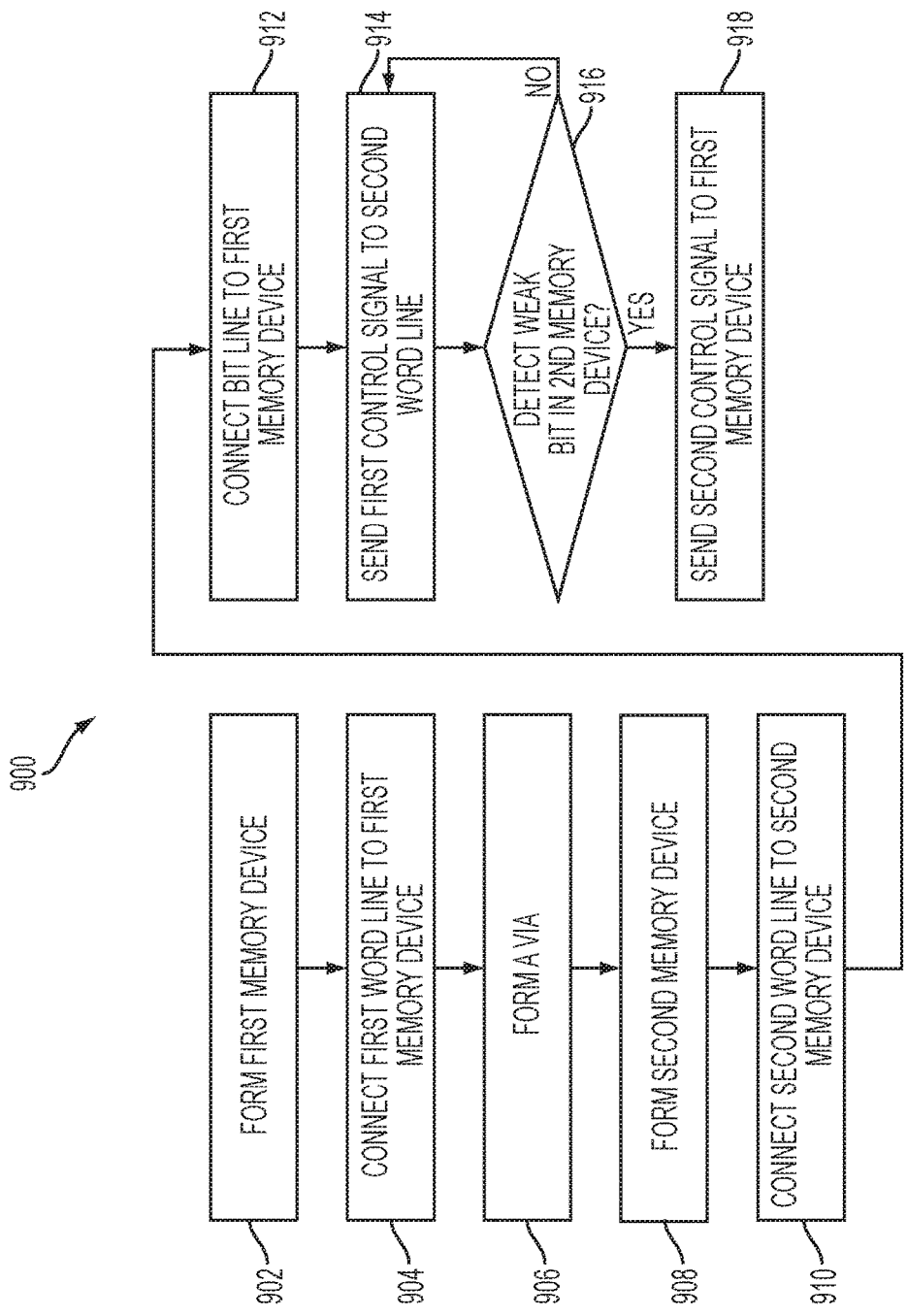
FIG. 9 is a flow chart of a method of forming a semiconductor structure in accordance with one or more embodiments.

FIG. 9 is a flow chart of a method 900 of forming a memory structure in accordance with one or more embodiments. One of ordinary skill in the art understands that FIG. 9 includes all of the various embodiments previously disclosed.

In operation 902, a first memory device is formed.

In operation 904, a first word line is connected to the first memory device. In some embodiments, an ILD is formed over the first memory device.

In operation 906, a first via is formed through the ILD. In some embodiments, a first and a second via are formed through the ILD.

In operation 908, a second memory device is formed above the first memory device. In some embodiments, the second memory device partially overlaps the first memory device. In some embodiments, the first and second memory devices are separated by the ILD. In some embodiments, the first via electrically connects the first and second memory devices. In some embodiments, the second via electrically connects the first and second memory devices.

In operation 910, a second word line is connected to the second memory device. In some embodiments, the first word line of the first memory device is connected to the second word line of the second memory device. In some embodiments, the first via connects the first word line of the first memory device to the second word line of the second memory device. In some embodiments, the second via connects the first word line of the first memory device to the second word line of the second memory device. In some embodiments, the first word line is connected to the first memory device by the second via. In some embodiments, the second word line is connected to the second memory device by the second via.

In operation 912, a bit line is connected to the first memory device. In some embodiments, the bit line is connected to the first and second memory device by the first via. In some embodiments, the bit line is connected to the first memory device by the first via. In some embodiments, the bit line is connected to the second memory device by the first via.

In operation 914, a first control signal is sent on the second word line. In some embodiments, the first control signal controls a current of the second memory device.

In operation 916, a determination is made by the second memory device if a weak bit is detected. If the weak bit is detected, the process proceeds to operation 918 to attempt to improve the performance of the first and second memory device. If the weak bit is not detected, the process proceeds to operation 914.

In operation 918, a second control signal is sent on the first word line. In some embodiments, the first control signal controls a current of the second memory device and the second control signal controls a current of the first memory device.

In one or more embodiments, operations 914, 916 and 918 of the flowchart illustrated in FIG. 9 are repeated for each cycle of a clock connected to the first and second memory devices. In one or more embodiments, operations 916 and 918 are optional.

One aspect of this description relates to a three-dimensional integrated circuit (3D IC). The 3D-IC includes a first transistor, a word line, a first via, a second transistor, and a second via. The first transistor is on a first level and the second transistor is on a second level. The second level is different from the first level. The word line and the first via are coupled to the first transistor. The second via is coupled between the first transistor and the second transistor.

Another aspect of this description relates to a three-dimensional integrated circuit (3D IC). The 3D-IC includes a first control line coupled to a first transistor, and a first via coupled to at least a first region of the first transistor. The 3D IC further includes a second control line coupled to a second transistor, and a second via coupled to a second region of the first transistor. The second transistor is under the first transistor. The second region of the first transistor is different from the first region of the first transistor.

Still another aspect of this description relates to a method of making a semiconductor device. The method includes forming a first memory device, connecting a first word line to the first memory device, forming a first via, forming a second memory device, connecting a second word line to the second memory device, connecting a bit line to the first memory device and connecting the bit line to the second memory device by the first via. The first and second memory devices are separated by an ILD and the first via connects the first and the second memory devices.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A three-dimensional integrated circuit comprising:
a first transistor on a first level;
a word line coupled to the first transistor;
a first via coupled to the first transistor;
a second transistor on a second level different from the first level;
another word line coupled to the second transistor; and
a second via coupled between the first transistor and the second transistor.

2. The three-dimensional integrated circuit of claim 1, further comprising:
an insulating layer between the first level and the second level, the first transistor being part of a first memory device, and the second transistor being part of a second memory device.

3. The three-dimensional integrated circuit of claim 1, further comprising:
a third via coupled to the word line and the first transistor, the third via being different from the second via.

4. The three-dimensional integrated circuit of claim 3, wherein the another word line is coupled to the third via, and the first via being further coupled to a ground terminal.

5. The three-dimensional integrated circuit of claim 1, further comprising:
a third via, and
a bit line coupled to the second transistor by at least the third via.

6. The three-dimensional integrated circuit of claim 1, further comprising:
a third via coupled to the second transistor and the first via, the second transistor comprising:
a first region coupled to a ground terminal, and
a second region coupled to the third via.

7. The three-dimensional integrated circuit of claim 6, further comprising:
a fourth via coupled to a first region of the first transistor; and
a fifth via coupled between the first region of the second transistor and the ground terminal.

8. The three-dimensional integrated circuit of claim 1, wherein the second via is an inter-layer via having a height ranging from about 30 nanometers (nm) to about 70 nm.

9. The three-dimensional integrated circuit of claim 1, wherein at least one of the first via, the second via or a third via has a circular shape or a rectangular shape.

10. A three-dimensional integrated circuit, comprising:
a first transistor;
a first word line coupled to the first transistor;
a first via coupled to at least a first region of the first transistor;
a second transistor under the first transistor;
a second word line coupled to the second transistor, and
a second via coupled to a second region of the first transistor, the second region of the first transistor being different from the first region of the first transistor.

11. The three-dimensional integrated circuit of claim 10, further comprising:
a third via coupled between the first word line and the second word line.

12. The three-dimensional integrated circuit of claim 10, wherein the second region of the first transistor is coupled to a ground terminal.

13. The three-dimensional integrated circuit of claim 10, wherein the second transistor comprises a first region configured to be electrically floating.

14. The three-dimensional integrated circuit of claim 10, further comprising:
a third via between the first transistor and the second transistor.

15. The three-dimensional integrated circuit of claim 14, further comprising:
a fourth via coupled between a region of the second transistor and a ground terminal.

16. The three-dimensional integrated circuit of claim 15, further comprising:
a fifth via coupled to another region of the second transistor, wherein the third via is coupled to the first via and the fifth via.

17. The three-dimensional integrated circuit of claim 14, wherein the third via has a diameter ranging from about 10.5 nanometers (nm) to about 11.5 nm.

18. The three-dimensional integrated circuit of claim 14, wherein the third via is an inter-layer via having a height ranging from about 75 nanometers (nm) to about 140 nm.

19. A three-dimensional semiconductor device, comprising:

a first memory device;
a first via coupled to a first portion of the first memory device;
a first word line coupled to the first memory device;
a second memory device above the first memory device;
a second word line coupled to the second memory device;
an insulating layer between the first memory device and the second memory device; and
a second via coupled to the first memory device and the second memory device.

20. The three-dimensional semiconductor device of claim 19, further comprising:
the second word line being above the first word line and the first memory device;
a third via coupled to a first portion of the second memory device;
a fourth via coupled between the first word line and the second word line; and
a fifth via coupled to a second portion of the second memory device different from the first portion of the second memory device.

\* \* \* \* \*